United States Patent [19]

Peterson

[11] Patent Number: 4,521,739

[45] Date of Patent: Jun. 4, 1985

[54] LOW OFFSET VOLTAGE TRANSISTOR BRIDGE TRANSCONDUCTANCE AMPLIFIER

[75] Inventor: William A. Peterson, Hanover Township, Morris County, N.J.

[73] Assignee: AT&T Bell Laboratories, Murray Hill, N.J.

[21] Appl. No.: 498,257

[22] Filed: May 26, 1983

[51] Int. Cl.[3] ............................................ H03F 3/45

[52] U.S. Cl. .................................. 330/257; 330/260; 330/288; 330/311

[58] Field of Search ............... 330/257, 288, 311, 258, 330/260

[56] References Cited

U.S. PATENT DOCUMENTS 4,059,808 11/1977 Sakamoto et al. .................. 330/257
4,151,482 4/1979 Robe ............................... 330/311 X
4,354,122 10/1982 Embree et al. ..................... 307/261

*Primary Examiner*—James B. Mullins
*Assistant Examiner*—Steven J. Mottola
*Attorney, Agent, or Firm*—Alfred G. Steinmetz

[57] ABSTRACT

A transconductance amplifier capable of operating from a single supply voltage includes a differential input stage energized by a current mirror current source. Small voltages are sensed across the emitter junctions of the two transistors of the differential input stage. A feedback arrangement is included to stabilize the gain of the transconductance amplifier.

5 Claims, 1 Drawing Figure

LOW OFFSET VOLTAGE TRANSISTOR BRIDGE TRANSCONDUCTANCE AMPLIFIER

TECHNICAL FIELD

This invention relates to transconductance amplifiers and, more particularly, to a voltage-to-current translation amplifier that does not comprise or utilize an operational amplifier.

BACKGROUND OF THE INVENTION

It is frequently desirable to sense a voltage and convert it into a current signal. One particular example is in sensing a current level where a voltage sensed across a current sensing resistor is converted into a current signal to drive protective or alarm circuitry. Typically, the transconductance function is performed by a transconductance amplifier circuit utilizing an operational amplifier. Since the sensing voltage across the small impedance of the sensing resistor is generally very small (i.e., low millivolt range) the operational amplifier must be carefully trimmed to eliminate any error-inducing effect that its offset voltage characteristic might cause. The trimming techniques utilized to eliminate the offset voltages add considerably to the expense of the operational amplifier. A further complication introduced by using an operational amplifier is a bias arrangement requirement of two voltages of opposite polarity as the bias source for the operational amplifier.

SUMMARY OF THE INVENTION

Therefore, an amplifier, embodying the principles of the invention, and having inherent transconductance amplification properties, comprises a plurality of amplifying transistors coupled in a quasi-bridge-type arrangement, which is utilized as a current sense amplifier in order to sense very small voltages occurring across a current shunt. It achieves amplification of this sensed voltage with very low offset voltage through application of emitter ballast resistors operative to counter current differentials occurring due to differences in the base emitter junction characteristics of the amplifying transistors.

The transconductance amplifier includes a differential input stage having the emitter electrodes of its amplifying transistors coupled to sense the voltage of the current shunt through identical emitter ballast resistors. A current mirror source, including base current control to maintain current balance therein, is coupled to supply a balanced current to the differential input stage.

The current output signal of the transconductance amplifier is supplied from a common node at the joining of the current mirror source and the differential inputs. Current feedback from an output stage amplifier is applied to an emitter of an amplifying transistor at the differential input stage to assure continued current balance in the emitter ballast resistors and achieve amplification gain control.

BRIEF DESCRIPTION OF THE DRAWING

An understanding of the invention may be readily attained by reference to the following specification and the drawing, in which the sole FIGURE is a schematic of transconductance amplifying circuit embodying the principles of the invention.

DETAILED DESCRIPTION

Figure 1:
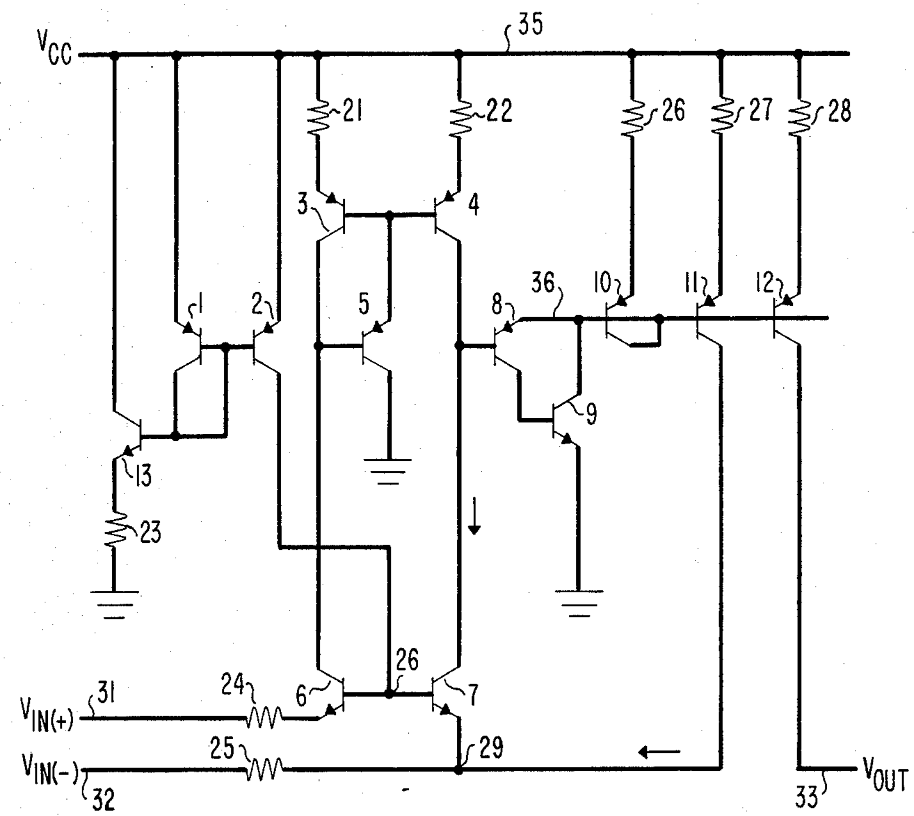

A transconductance amplifier embodying the principles of the invention comprises two PNP transistors 3 and 4 and two NPN transistors 6 and 7 connected in a quasi-bridge-type arrangement. The emitters of transistors 6 and 7 are coupled through emitter ballast resistors 24 and 25 to terminals 31 and 32, which are coupled to the voltage to be sensed, which may be a shunt or resistor in the milliohm range inserted in a current path in order to sense a current flow therein.

A voltage bias $V_{cc}$ is supplied to a voltage rail 35 and coupled to the emitters of transistors 3 and 4 via the emitter ballast resistors 21 and 22. Bias current is supplied to the base electrodes of transistors 6 and 7 from the collector of transistor 2 which, in combination with transistor 1, forms a current mirror-to-mirror the base current of transistor 13 to the base electrodes of transistors 6 and 7. This arrangement is operative to compensate for current gain variations of transistors 6 and 7; and, hence, control the emitter currents independent of their individual junction characteristics.

Output current from the quasi-bridge amplifier is applied from the node common to the collectors of transistors 4 and 7 to the base of transistor 8 whose emitter is connected to the output current rail 36. Transistors 8 and 9 are compound-connected to form an amplifier stage to drive the current output rail 36. The output of the amplifier stage is coupled through a stabilizing transistor 10 to a feedback transistor 11, which feeds back a current proportional to the rail current to a junction 29, of the emitter of transistor 7, and the emitter ballast resistor 25. The output current signal is supplied by the collector of transistor 12 to output terminal 33.

The invention may be readily understood from the following description of the operation of the illustrative circuit in the drawing. The leads 31 and 32 are coupled across an impedance, such as a current shunt, whose voltage is to be sensed. These leads are coupled via ballast resistors 24 and 25 to the emitters of transistors 6 and 7, respectively. Transistors 6 and 7, in combination with transistors 3 and 4, form a quasi-bridge-type differential stage-type amplifier. The emitter of transistors 3 and 4 are coupled through ballast resistors 21 and 22 to a positive voltage rail 36 which, in turn, is connected to a positive voltage source $V_{cc}$. Since transistor 5 mirrors the current in transistor 3 to transistor 4, the current flow in transistors 6 and 7 tends to be equal or balanced.

Current flow from the positive voltage rail 36 through transistor 13 is maintained substantially constant by resistor 23. Its (transistor 13's) base current is a function of its current gain. This base current is mirrored by the current mirror comprising transistors 1 and 2 onto the collector of transistor 2. The collector current of transistor 2 is applied as a base current to node 26 and divides essentially equally into the base electrodes of transistors 6 and 7 if their emitter voltages are identical. Hence, the emitter current is constant so long as current gain of transistors 13, 6 and 7 is substantially identical. The emitter ballast resistors 24 and 25 are operative to counteract any slight imbalance in the transistor current gains of transistors 6 and 7.

Biasing of transistors 6 and 7 is such that, as long as leads 31 and 32 are at the same voltage potential, current level in transistors 6 and 7 is identical. Hence, no base current is applied to the base of transistor 8; and no output current is developed on the output current rail 36.

If a voltage is applied to terminals 31 and 32 such that lead 31 is positive with respect to lead 32, the same voltage differential applied through the ballast resistors 24 and 25 reduces conduction in transistor 6 and increases conduction in transistor 7. Since the current in transistors 3 and 4 remains balanced, or substantially equal, the deficiency in collector current of transistor 4 flows from the base of transistor 8, biasing it conducting.

Transistors 8 and 9 function as an amplifier stage coupled to feedback transistor 11 through transistor 10, which is operative to stabilize the semiconductive devices connected to rail 36. The current on rail 36 flows through feedback transistor 11 to output transistor 12, whose collector is connected to output terminal 33. The output signal representation of the voltage difference between input leads 31 and 32 is a current in the collector of transistor 12, which is coupled to output lead 33

Normally, the emitters of transistors 6 and 7 attempt to maintain the same voltage potential. When a voltage differential at leads 31 and 32 unbalances transistors 6 and 7, the feedback transistor 11 supplies a feedback current proportional to the sensed voltage at leads 31 and 32. The current flows through ballast resistor 25, and the voltage drop thereacross attempts to restore the voltage equality of the emitters of transistors 6 and 7 and, in turn, rebalance current flow in the two current paths of the bridge.

It is readily apparent that the transconductance amplifier described herein eliminates the offset error voltage problem of transconductance amplifiers utilizing operational amplifiers. A further advantage is an increased range of acceptable input sensing voltages over that of the prior art transconductance amplifiers. Any voltage level may be sensed as long as it falls between $V_{cc}$-2 V and the negative breakdown voltage of the transistors. While a circuit adapted to one polarity-type signals and devices has been described, it is to be understood that circuits designed to accept a different polarity sense voltage by utilizing different polarity semiconducting devices would still be within the scope of the invention.

What is claimed is:

1. A transconductance amplifier comprising:

a differential input stage operative for accepting a voltage signal input and including:

first and second transistors having their base electrodes connected together to receive a common bias signal, first and second resistors connected in series with first and second emitter electrodes of the first and second transistors respectively, and the first and second resistors being connected to sense the voltage signal input; whereby a series connection of the first resistor, a base emitter junction of the first transistor, a base emitter junction of the second transistor and the second resistor are connected in parallel with the voltage signal input a current mirror source including third, fourth and fifth transistors and the third and fourth transistors being coupled to supply current to collector electrodes of the first and second transistors respectively, and the fifth transistor being coupled jointly to a base electrode of the third and fourth transistors for controlling a base current therein, and output means coupled to a node joining the second and fourth transistors and including a sixth transistor for providing a current feedback signal connected to the second emitter.

2. A transconductance amplifier as defined in claim 1 wherein the current mirror source includes emitter electrode of the third and fourth transistors coupled through ballast resistors to an energizing voltage source.

3. A transconductance amplifier as defined in claim 1 wherein the output means includes amplification means energized by a voltage source common to the current mirror source.

4. A transconductance amplifier as defined in claim 3 wherein the voltage signal input is derived from a current shunt at substantially ground potential.

5. A transconductance amplifier as defined in claim 3 further including a substantially constant current source and a second current mirror connected to reflect current in the current source into the base electrodes of the first and second transistors.

* * * * *